(12) United States Patent
Kumar et al.

(10) Patent No.: US 9,196,598 B1
(45) Date of Patent: Nov. 24, 2015

(54) SEMICONDUCTOR DEVICE HAVING POWER DISTRIBUTION USING BOND WIRES

(71) Applicants: Shailesh Kumar, Ghaziabad (IN); Rishi Bhooshan, Ghaziabad (IN); Vikas Garg, Parvatiya Vihar (IN); Chetan Verma, Noida (IN); Navas Khan Oratti Kalandar, Petaling Jaya (MY)

(72) Inventors: Shailesh Kumar, Ghaziabad (IN); Rishi Bhooshan, Ghaziabad (IN); Vikas Garg, Parvatiya Vihar (IN); Chetan Verma, Noida (IN); Navas Khan Oratti Kalandar, Petaling Jaya (MY)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/302,425

(22) Filed: Jun. 12, 2014

(51) Int. Cl.
 *H01L 23/48* (2006.01)
 *H01L 23/00* (2006.01)

(52) U.S. Cl.
 CPC ......... *H01L 24/49* (2013.01); *H01L 2224/4917* (2013.01); *H01L 2924/30101* (2013.01)

(58) Field of Classification Search
 CPC ........... H01L 2224/49175; H01L 2224/48091; H01L 2224/48227; H01L 23/50; H01L 2224/4971
 See application file for complete search history.

(56) References Cited

U.S. PATENT DOCUMENTS

| | | | |
|---|---|---|---|
| 5,060,052 A | 10/1991 | Casto et al. | |
| 5,838,072 A | 11/1998 | Li et al. | |
| 6,025,616 A * | 2/2000 | Nguyen et al. | 257/207 |
| 6,097,098 A * | 8/2000 | Ball | 257/786 |
| 6,319,755 B1 | 11/2001 | Mauri | |
| 6,670,214 B1 * | 12/2003 | Chia et al. | 438/106 |
| 6,770,963 B1 * | 8/2004 | Wu | 257/691 |
| 7,109,589 B2 * | 9/2006 | Brennan et al. | 257/784 |
| 7,256,482 B2 | 8/2007 | Kummerl et al. | |
| 7,550,318 B2 | 6/2009 | Hess et al. | |
| 7,829,997 B2 | 11/2010 | Hess et al. | |
| 7,855,579 B2 * | 12/2010 | Fujiyama et al. | 326/101 |
| 8,129,226 B2 | 3/2012 | Johnston et al. | |
| 8,154,134 B2 | 4/2012 | Bonifield et al. | |
| 8,258,616 B1 * | 9/2012 | Liou | 257/692 |
| 2004/0178498 A1 | 9/2004 | Alagaratnam | |

OTHER PUBLICATIONS

Sanjay Pant, "Design and Analysis of Power Distribution Networks in VLSI Circuits", University of Michigan Dissertation, 2008.
Christopher Carr, Juan Munar, William Crockett, Robery Lyn, "Robust Wirebonding of X-Wire Insulated Bonding Wire Technology", Proceedings 39th IMAPS, 2007.

* cited by examiner

*Primary Examiner* — John C Ingham
(74) *Attorney, Agent, or Firm* — Charles Bergere

(57) ABSTRACT

A semiconductor device uses insulated bond wires to connect peripheral power supply and ground bond pads on the periphery of the device to array power supply and ground bond pads located on an interior region of a integrated circuit die of the device. Power supply and ground voltages are conveyed from array bond pads using vertical vias down to one or more corresponding inner power distribution layers. The bond wire connections form rows and columns of hops constituting a mesh power grid that reduces the IR drop of the semiconductor device.

6 Claims, 3 Drawing Sheets

SEMICONDUCTOR DEVICE HAVING POWER DISTRIBUTION USING BOND WIRES

BACKGROUND OF THE INVENTION

The present invention relates generally to semiconductor devices, and more particularly to power distribution connections between the device package and an integrated circuit die.

According to some conventional designs for semiconductor devices an integrated circuit (IC) die is mounted on a substrate within a package housing with bond wires providing electrical connections between bond pads on the substrate and bond pads located around the periphery of the top surface of the die. Some of those electrical connections are for transmitting signals to and from the die, while others are for providing power to the die in the form of power supply and ground voltages.

In a conventional packaged semiconductor device, a bond wire power connection (i.e., either power supply or ground voltage) involves a bond wire connecting a power supply bond pad on the substrate to a power supply bond pad on the periphery of the top surface of the die. The voltage is then routed horizontally and/or vertically into the die using metal traces within the die's bond pad layer and/or metal vias to one or more locations within one or more particular die layers within the interior of the die where that voltage is needed.

In order to keep IC dies as small as possible, die layers are kept as thin as possible, and the area of the die layers is kept as small as possible. As a result, the resistances of the conductive traces used to propagate power currents within the die layers are relatively high, resulting in relatively high IR drop. The present invention provides an improved method of routing power and ground voltages from the device leads to the integrated circuit die.

BRIEF DESCRIPTION OF THE DRAWINGS

Embodiments of the present disclosure are illustrated by way of example and are not limited by the accompanying figures, in which like references indicate similar elements. Elements in the figures are illustrated for simplicity and clarity and have not necessarily been drawn to scale. For example, the thicknesses of connections and regions may be exaggerated for clarity.

DETAILED DESCRIPTION OF THE INVENTION

Detailed illustrative embodiments of the present disclosure are disclosed herein. However, specific structural and functional details disclosed herein are merely representative for purposes of describing example embodiments of the present disclosure. Embodiments of the present disclosure may be embodied in many alternative forms and should not be construed as limited to only the embodiments set forth herein. Further, the terminology used herein is for the purpose of describing particular embodiments only and is not intended to be limiting of example embodiments of the disclosure.

One embodiment of the present invention is a semiconductor device comprising a top surface having a periphery and an interior region located within the periphery; peripheral power supply and ground bond pads located at the periphery; array power supply and ground bond pads located within the interior region; and a mesh power grid. The mesh power grid comprises one or more power supply rows comprising two or more bond wire hops interconnecting corresponding peripheral power supply bond pads and array power supply bond pads; one or more power supply columns comprising two or more bond wire hops interconnecting corresponding peripheral power supply bond pads and array power supply bond pads; one or more ground rows comprising two or more bond wire hops interconnecting corresponding peripheral ground bond pads and array ground bond pads; and one or more ground columns comprising two or more bond wire hops interconnecting corresponding peripheral ground bond pads and array ground bond pads.

Figure 1A:
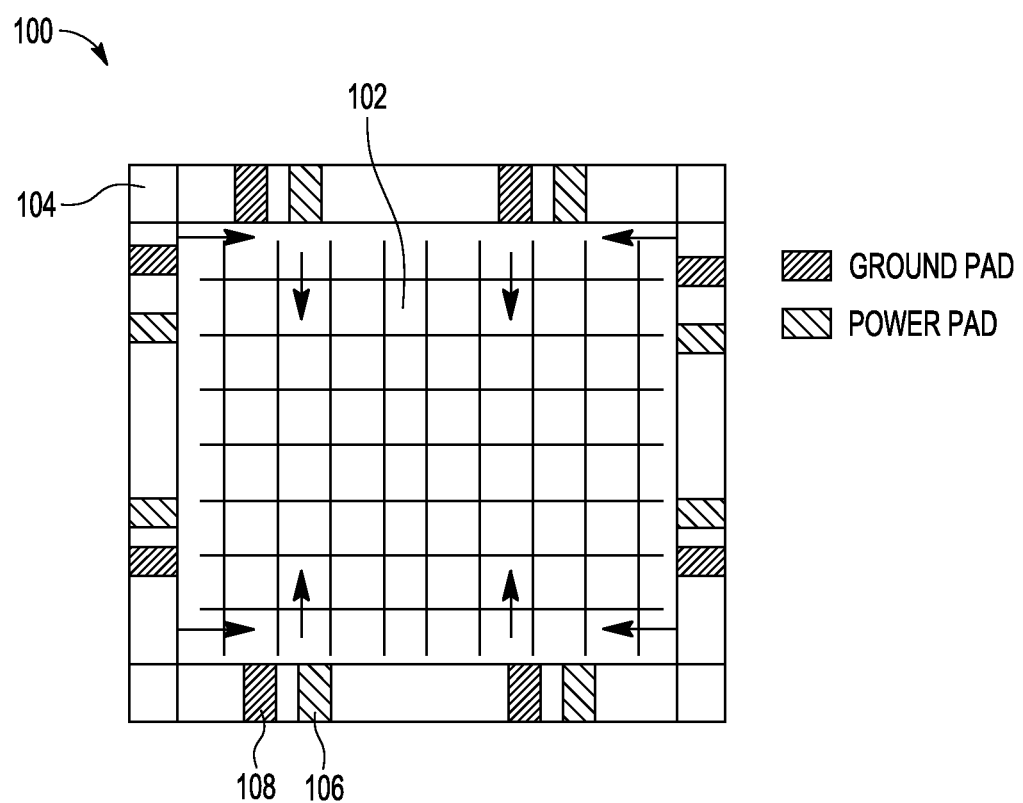
FIG. 1A is a simplified top plan view of a portion of a semiconductor device according to an embodiment of the present invention.

FIG. 1A shows a simplified top plan view of an inner power distribution layer 102 of a die 100, which is similar to existing layers in conventional dies. Shown in FIG. 1A is the periphery 104, which is located at the top surface of the die 100, and the inner power distribution layer 102, which exists within the die 100. Die 100 typically has a number of different instances of inner power distribution layer 102 at different depths within die 100, each of which is used for a specific voltage level, such as the power supply voltage level or the ground voltage level. Periphery 104 has a number of peripheral bond pads, such as power supply bond pads 106, ground bond pads 108, and, in some embodiments, signal bond pads (not shown).

A power supply voltage is conveyed from off the die 100 to the peripheral power supply bond pads 106 via bond wires (not shown) and then to one or more instances of the inner power distribution layer 102. Similarly, a ground voltage is conveyed from off the die 100 to the peripheral ground bond pads 108 via bond wires (not shown) and then to one or more other instances of the inner power distribution layer 102.

Figure 1B:
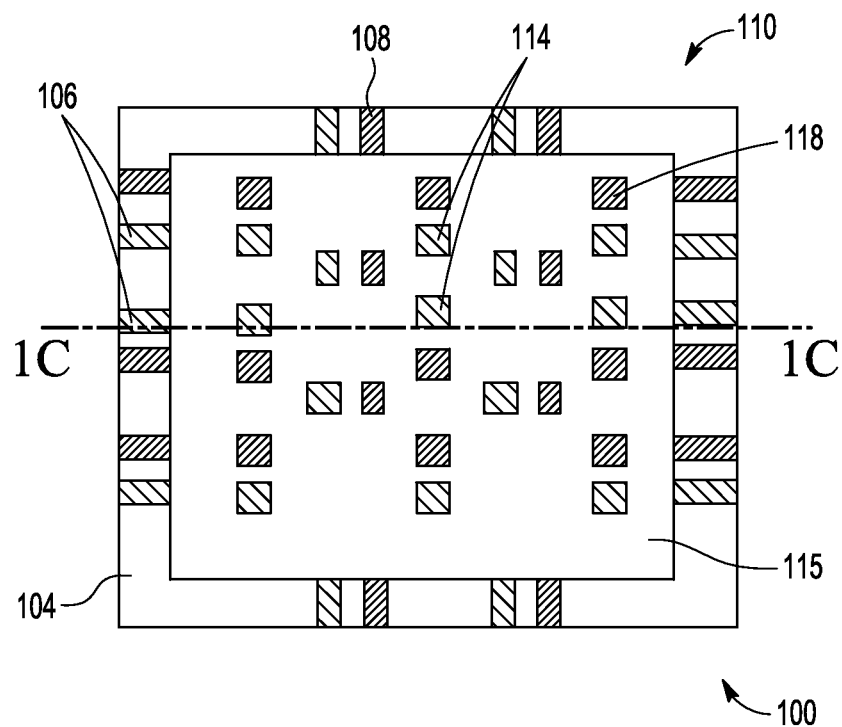
FIG. 1B is a simplified top plan view of a portion of a semiconductor device according to an embodiment of the present invention.

FIG. 1B shows a simplified top plan view of top surface 110 of die 100 prior to attachment of any bond wires, in accordance with an embodiment of the disclosure. As shown in FIG. 1B, top surface 110 has an interior region 115 located within the periphery 104. Interior region 115 has a distribution of array power supply bond pads 114 and array ground bond pads 118.

Figure 1C:
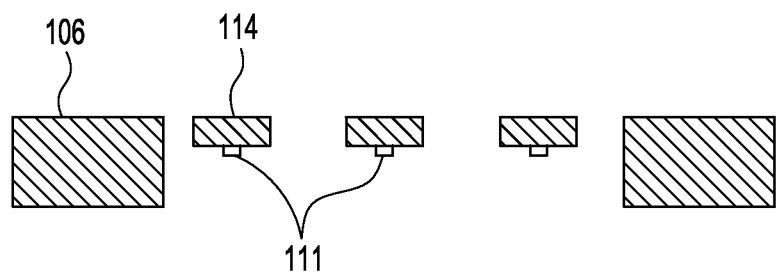
FIG. 1C is a partial cross-sectional view of the semiconductor device of FIG. 1B taken along the line 1C-1C.

FIG. 1C shows a cross-sectional view of the peripheral power supply bond pads 106 and array power supply bond pads 114 taken along the line 1C-1C in FIG. 1B. The peripheral power supply bond pads 106 extend the thickness of the die 100. The array power supply bond pads 114 have extending below them vias 111 that distribute power to an inner power distribution layer. Vias may also be provided below array ground bond pads 118 (not shown in FIG. 1C).

Figure 1D:
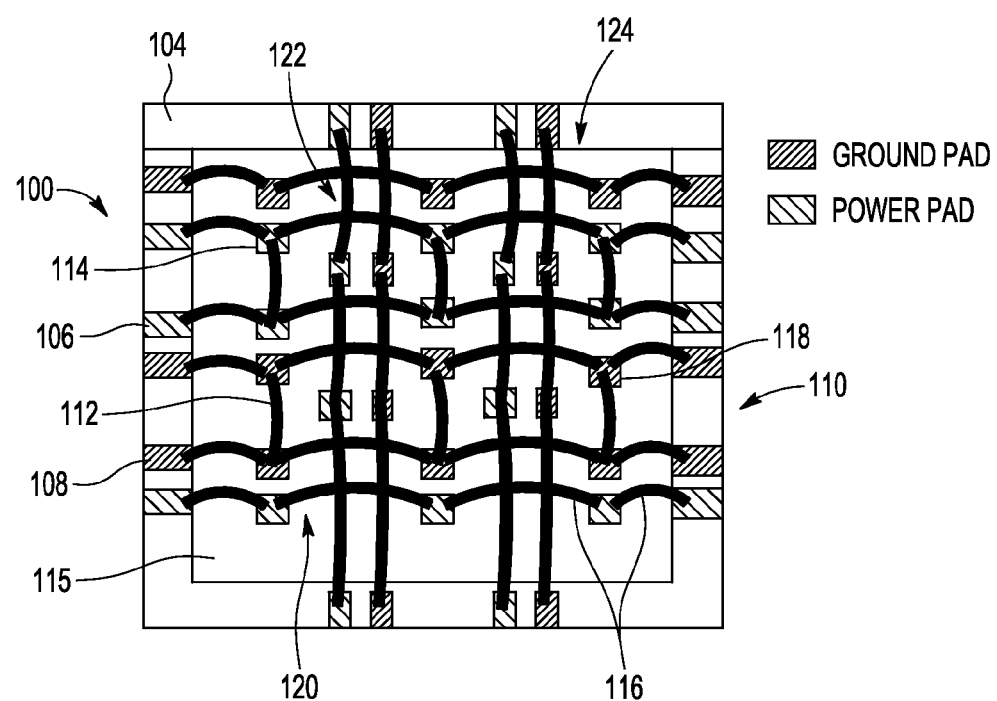
FIG. 1D is a simplified top plan view of a portion of a semiconductor device according to an embodiment of the present invention.

Referring now to FIG. 1D, bond wires 112 are bonded across the top surface 110 to form a mesh power grid 124 of hops 116 aligned in rows 120 and columns 122. In particular, for each peripheral power supply bond pad 106 located on the left edge of die 100 as shown in FIG. 1D, there are one or more corresponding array power supply bond pads 114 and a corresponding peripheral power supply bond pad 106 located on the right edge of die 100, all of which are interconnected by a full power supply row 120 of wire-bond hops 116 in the mesh. Similarly, for each peripheral power supply bond pad 106 located on the top edge of die 100 as shown in FIG. 1D, there are one or more corresponding array power supply bond pads 114 and a corresponding peripheral power supply bond pad 106 located on the bottom edge of die 100, all of which are interconnected by a full power supply column 122 of wire-bond hops 116 in the mesh. The analogous is also true for each peripheral ground bond pad 108 located on the left edge and on the top edge of die 100 to form corresponding full ground rows and full ground columns of wire-bond hops in the mesh.

In the exemplary embodiment shown in FIG. 1D, there are six full rows 120, three of which are power supply rows and three of which are ground rows, each having four hops 116, and four full columns 122, two of which are power supply columns and two or which are ground columns, each having three hops 116. It should be understood that alternative embodiments may have more or fewer rows and/or columns having more or fewer hops.

In addition, there may be one or more partial rows and/or columns of hops. In particular, die 100 has three partial power supply columns of hops and three partial ground columns of hops, where each partial column has a pair of array power supply bond pads or a pair of array ground bond pads connected by a single hop. Note that, the two array bond pads in each of these pairs are also part of two different rows of hops. The partial power supply columns connect adjacent or proximate rows of array power supply bond pads, and the partial ground columns connect adjacent or proximate rows of array ground bond pads. The partial power supply and ground columns provide additional connections throughout the power mesh grid 124 to further assist in distributing voltages in the die 100.

Preferably the bond wires 112 are insulated using an organic coating or an oxide of metal from which the wire is made. Non-insulated wires may be used in some embodiments for some or all of the hops, provided the non-insulated wires for different voltage levels do not electrically interfere with each other. For instance, the bond wires for one voltage level (e.g., a power supply voltage) may be insulated while the bond wires for a different voltage level (e.g., a ground voltage) may be non-insulated. In another embodiment, the bond wires forming the rows may be insulated, while the bond wires forming the columns may be non-insulated, or vice-versa.

Instead of routing voltages from peripheral bond pads 106 and 108 first vertically, for example, using vertical vias (not shown) and then horizontally within different instances of the inner power distribution layer 102 of FIG. 1A, as in the prior art, voltages according to the invention are routed horizontally from peripheral bond pads 106 and 108 through bond wires 112 to corresponding array bond pads 114 and 118 located within the interior region 115 of the top surface 110. Vias 111 below the array bond pads 114 and 118 then bring the voltages vertically down to the particular inner power distribution layers 102 where they are needed.

Employing a mesh power grid 124 of bond wires 112 across the top surface 110 helps eliminate the need for a power grid at the die level. Reducing the need for an interior-layer power grid frees up resources for interior-layer signal routing and improves the design efficiency through die area reduction. The mesh power grid 124 can further provide better thermal dissipation. There is also better uniformity in power supply and ground voltage distribution since insulated wires allow cross-over between power supply and ground hops.

As a result, the IR drop for semiconductor devices made in accordance with embodiments of the present disclosure can be significantly lower than IR drops for comparable devices of the prior art. In the devices employing a mesh power grid of the invention, IR drop improved by up to 50%. The decreased IR drop effectively increases the supply voltage to each transistor in the design by this amount leading to faster operation and improved design performance.

Further, using the mesh power grid 124 helps overcome the drawbacks of designs that permit only a limited number of pads on the periphery since power supply and ground pads can be removed while still remaining within IR drop specification targets.

Although the invention has been described in the context of a mesh power grid distributing a single power supply voltage and a single ground voltage, it will be understood that the invention can also be implemented in the context of a mesh power grid having three or more different voltage levels, such as two or more different power supply voltage levels and one or more different ground levels.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures. For example, two figures shown in succession may in fact be executed substantially concurrently or may sometimes be executed in the reverse order, depending upon the functionality/acts involved.

Although the invention has been described using relative terms such as "front," "back," "top," "bottom," "over," "above," "under" and the like in the description and in the claims, such terms are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Unless stated otherwise, terms such as "first" and "second" are used to arbitrarily distinguish between the elements such terms describe. Thus, these terms are not necessarily intended to indicate temporal or other prioritization of such elements. Further, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Although the disclosure is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

The invention claimed is:

1. A semiconductor device comprising:
   a top surface having a periphery and an interior region located within the periphery;
   peripheral power supply and ground bond pads located at the periphery;
   array power supply and ground bond pads located within the interior region; and
   a mesh power grid comprising:
      one or more power supply rows comprising two or more bond wire hops interconnecting corresponding peripheral and array power supply bond pads;
      one or more power supply columns comprising two or more bond wire hops interconnecting corresponding peripheral and array power supply bond pads;
      one or more ground rows comprising two or more bond wire hops interconnecting corresponding peripheral and array ground bond pads; and
      one or more ground columns comprising two or more bond wire hops interconnecting corresponding peripheral and array ground bond pads,
   wherein the one or more power supply and ground rows and columns are full rows and columns, where each full row crosses all of the full columns and each full column crosses all of the full rows.

2. The semiconductor device of claim 1, wherein each bond wire in each bond wire hop is insulated.

3. The semiconductor device of claim 1, wherein the mesh power grid further comprises one or more partial rows or columns, wherein:
   each partial row connects two different columns; and
   each partial column connects two different rows.

4. The semiconductor device of claim 1, further comprising:
   one or more vias connecting corresponding array power supply bond pads to one or more inner power distribution layers to bring a power supply voltage vertically down to the one or more inner power distribution layers; and
   one or more other vias connecting corresponding array ground bond pads to one or more other inner power distribution layers to bring a ground voltage vertically down to the one or more other inner power distribution layers.

5. A semiconductor device, comprising:
A semiconductor device comprising:
   a top surface having a periphery and an interior region located within the periphery;
   peripheral power supply and ground bond pads located at the periphery;
   array power supply and ground bond pads located within the interior region; and
   a mesh power grid comprising:
      one or more power supply rows comprising two or more bond wire hops interconnecting corresponding peripheral and array power supply bond pads;
      one or more power supply columns comprising two or more bond wire hops interconnecting corresponding peripheral and array power supply bond pads;
      one or more ground rows comprising two or more bond wire hops interconnecting corresponding peripheral and array ground bond pads; and
one or more ground columns comprising two or more bond wire hops interconnecting corresponding peripheral and array ground bond pads, wherein bond wires for one voltage level are insulated and bond wires for a different voltage level are non-insulated.

6. A semiconductor device, comprising:
a top surface having a periphery and an interior region located within the periphery;
peripheral power supply and ground bond pads located at the periphery;
array power supply and ground bond pads located within the interior region; and
a mesh power grid comprising:
   one or more power supply rows comprising two or more bond wire hops interconnecting corresponding peripheral and array power supply bond pads;
   one or more power supply columns comprising two or more bond wire hops interconnecting corresponding peripheral and array power supply bond pads;
   one or more ground rows comprising two or more bond wire hops interconnecting corresponding peripheral and array ground bond pads; and
one or more ground columns comprising two or more bond wire hops interconnecting corresponding peripheral and array ground bond pads, wherein bond wires of at least one of the rows or columns are insulated and bond wires of the other of the rows or columns are non-insulated.

* * * * *